United States Patent
Honjou et al.

(10) Patent No.: US 8,300,456 B2
(45) Date of Patent: Oct. 30, 2012

(54) MAGNETIC RANDOM ACCESS MEMORY AND METHOD OF MANUFACTURING THE SAME

(75) Inventors: Hiroaki Honjou, Tokyo (JP); Tetsuhiro Suzuki, Tokyo (JP); Norikazu Ohshima, Tokyo (JP)

(73) Assignee: NEC Corporation, Tokyo (JP)

( * ) Notice: Subject to any disclaimer, the term of this patent is extended or adjusted under 35 U.S.C. 154(b) by 417 days.

(21) Appl. No.: 12/517,981

(22) PCT Filed: Oct. 22, 2007

(86) PCT No.: PCT/JP2007/070553
§ 371 (c)(1),
(2), (4) Date: Jul. 10, 2009

(87) PCT Pub. No.: WO2008/068967
PCT Pub. Date: Jun. 12, 2008

(65) Prior Publication Data
US 2010/0046288 A1    Feb. 25, 2010

(30) Foreign Application Priority Data
Dec. 6, 2006  (JP) ................ 2006-329810

(51) Int. Cl.
G11C 11/15  (2006.01)
H01L 29/82  (2006.01)
(52) U.S. Cl. ........ 365/173; 365/158; 365/171; 257/421; 257/E29.323
(58) Field of Classification Search .................. 257/421, 257/E29.323; 365/158, 171, 173
See application file for complete search history.

(56) References Cited

U.S. PATENT DOCUMENTS

| | | | |
|---|---|---|---|
| 5,640,343 A | 6/1997 | Gallagher et al. |
| 6,545,906 B1 | 4/2003 | Savtchenko et al. |
| 6,775,183 B2 | 8/2004 | Heide |
| 6,781,871 B2 | 8/2004 | Park et al. |
| 6,834,005 B1 | 12/2004 | Parkin |
| 7,064,934 B2 | 6/2006 | Mao et al. |
| 7,064,974 B2 | 6/2006 | Suzuki et al. |
| 7,184,301 B2 | 2/2007 | Sugibayashi et al. |
| 7,372,757 B2 | 5/2008 | Shin et al. |
| 7,459,737 B2 | 12/2008 | Ohmori et al. |

(Continued)

FOREIGN PATENT DOCUMENTS

JP  11-195824 A  7/1999

(Continued)

OTHER PUBLICATIONS

International Search Report for PCT/JP2007/070553 mailed Dec. 25, 2007.

(Continued)

*Primary Examiner* — Allison P Bernstein

(57) ABSTRACT

An MRAM has a pinned layer and a magnetic recording layer connected to the pinned layer through a tunnel barrier layer. The magnetic recording layer has a first free layer, a second free layer being in contact with the tunnel barrier layer, and an intermediate layer provided between the first free layer and the second free layer. The first free layer includes a magnetization switching region whose magnetization direction can be switched by domain wall motion method. The second free layer has no domain wall. The intermediate layer is formed to cover at least the magnetization switching region. The magnetization switching region and the second free layer are magnetically coupled to each other through the intermediate layer.

8 Claims, 12 Drawing Sheets

U.S. PATENT DOCUMENTS

| | | | |
|---|---|---|---|
| 7,532,504 B2 | 5/2009 | Saito | |
| 7,663,197 B2 | 2/2010 | Nagase et al. | |
| 7,859,881 B2 | 12/2010 | Iwata et al. | |
| 7,929,342 B2 * | 4/2011 | Numata et al. | 365/171 |
| 7,936,627 B2 * | 5/2011 | Fukami | 365/209 |
| 8,023,315 B2 * | 9/2011 | Fukami | 365/158 |
| 2002/0055016 A1 * | 5/2002 | Hiramoto et al. | 428/692 |
| 2003/0117837 A1 | 6/2003 | Park et al. | |
| 2004/0252414 A1 | 12/2004 | Mao et al. | |
| 2005/0002229 A1 | 1/2005 | Matsutera et al. | |
| 2006/0017126 A1 | 1/2006 | Bhattacharyya et al. | |
| 2006/0227466 A1 | 10/2006 | Yagami | |
| 2007/0058422 A1 | 3/2007 | Phillips et al. | |
| 2007/0194359 A1 | 8/2007 | Lim et al. | |
| 2010/0002501 A1 | 1/2010 | Leuschner et al. | |
| 2010/0046288 A1 | 2/2010 | Honjou et al. | |

FOREIGN PATENT DOCUMENTS

| | | | |
|---|---|---|---|
| JP | 2000195250 A | 7/2000 | |
| JP | 2002170937 A | 6/2002 | |
| JP | 2002208680 A | 7/2002 | |
| JP | 2005004942 A | 1/2005 | |
| JP | 2005505889 A | 2/2005 | |
| JP | 2005093488 A | 4/2005 | |
| JP | 2005123617 A | 5/2005 | |
| JP | 2005150303 A | 6/2005 | |
| JP | 2005191032 A | 7/2005 | |
| JP | 20065308 A | 1/2006 | |
| JP | 2006073930 A | 3/2006 | |
| JP | 2006073960 A | 3/2006 | |
| JP | 2006093578 A | 4/2006 | |
| JP | 2006270069 A | 10/2006 | |
| JP | 2007258460 A | 10/2007 | |
| JP | 2007317895 A | 12/2007 | |
| WO | 2006115275 A1 | 11/2006 | |
| WO | 2007015474 A | 2/2007 | |
| WO | 2007015475 A | 2/2007 | |
| WO | 2007020823 A | 2/2007 | |
| WO | WO 2007020823 A1 * | 2/2007 | |

OTHER PUBLICATIONS

K. Yagami, et al., "Research Trends in Spin Transfer Magnetization Switching", Journal of the Magnetics Society of Japan, vol. 28, No. 9, 2004, p. 937-947.

A. Yamaguchi, et al., "Real-Space Observation of Current-Driven Domain Wall Motion in Submicron Magnetic Wires", Physical Review Letters, vol. 92, No. 7, Feb. 20, 2004, 077205-1~4.

S. Mizukami et al., "The Study on Ferromagnetic Resonance Linewidth for NM/80NiFe/NM (NM=Cu, Ta, Pd and Pt) Films", Jpn. J. Appl. Phys., vol. 40, Feb. 2001, pp. 580-585.

H. Numata et al, "Magnetic Configuration of a New Memory Cell Utilizing Domain Wall Motion", Intermag 2006 Digest, HQ-03.

R. Scheuerlein et al., "A 10ns Read and Write Non-Volatile Memory Array Using a Magnetic Tunnel Junction and FET Switch in each Cell", 2000 IEEE International Solid-State Circuits Conference, Digest of Technical Papers, pp. 128-129.

M. Durlam et al., "Nonvolatile RAM based on Magnetic Tunnel Junction Elements", 2000 IEEE International Solid-State Circuits Conference, Digest of Technical Papers. pp. 130-131.

J. Shibata et al., "Effect of Spin Current on Uniform Ferromagnetism: Domain Nucleation", Physical Review Letters, Feb. 25, 2005, vol. 94, p. 076601-1-076601.4.

US Office Action for U.S. Appl. No. 12/297,153 issued Dec. 13, 2011.

US Office Action for U.S. Appl. No. 12/593,417 issued Oct. 19, 2011.

US Office Action for U.S. Appl. No. 12/529,387 issued Feb. 6, 2012.

US Office Action for U.S. Appl. No. 12/593,417 issued Mar. 9, 2012.

Japanese Office Action for JP2007-530951maild on May 11, 2012.

* cited by examiner

MAGNETIC RANDOM ACCESS MEMORY AND METHOD OF MANUFACTURING THE SAME

The present invention is the National Phase of PCT/JP2007/070553, filed Oct. 22, 2007, which is based on Japanese Patent Application No. 2006-329810 filed on Dec. 6, 2006 and claims advantage of the priority. All disclosures of the patent application are hereby incorporated by reference.

TECHNICAL FIELD

The present invention relates to a MRAM (Magnetic Random Access Memory). In particular, the present invention relates to a MRAM based on a spin transfer method and to a method of manufacturing the same.

BACKGROUND ART

A MRAM is a promising nonvolatile memory from a viewpoint of high integration and a high-speed operation. In the MRAM, a magnetoresistance element that exhibits a "magnetoresistance effect" such as a TMR (Tunnel MagnetoResistance) effect is utilized. In the magnetoresistance element, for example, a MTJ (Magnetic Tunnel Junction) in which a tunnel barrier layer is sandwiched by two ferromagnetic layers is formed. The two ferromagnetic layers include a pinned layer whose magnetization orientation is fixed and a free layer whose magnetization orientation is reversible.

It is known that a resistance value ($R+\Delta R$) of the MTJ when the magnetization orientations of the pinned layer and the free layer are "anti-parallel" to each other becomes larger than a resistance value (R) when the magnetization orientations are "parallel" to each other, due to the magnetoresistance effect. The MRAM uses the magnetoresistance element having the MTJ as a memory cell and nonvolatilely stores data by utilizing the change in the resistance value. Data writing to the memory cell is performed by switching the magnetization orientation of the free layer.

Conventionally known methods of data writing to the MRAM include an "asteroid method" and a "toggle method". According to these write methods, a magnetic switching field necessary for switching the magnetization of the free layer increases in substantially inverse proportion to the size of the memory cell. That is to say, a write current tends to increase with the miniaturization of the memory cell.

As a write method capable of suppressing the increase in the write current with the miniaturization, there is proposed a "spin transfer method". For example, refer to Japanese Laid-Open Patent Application JP-2005-93488 or "Yagami and Suzuki, Research Trends in Spin Transfer Magnetization Switching, Journal of The Magnetics Society of Japan, Vol. 28, No. 9, 2004". According to the spin transfer method, a spin-polarized current is injected to a ferromagnetic conductor, and direct interaction between spin of conduction electrons of the current and magnetic moment of the conductor causes the magnetization to be switched (hereinafter referred to as "spin transfer magnetization switching"). The spin transfer magnetization switching will be outlined below with reference to FIG. 1.

In FIG. 1, a magnetoresistance element is provided with a free layer 101, a pinned layer 103 and a tunnel barrier layer 102 that is a nonmagnetic layer sandwiched between the free layer 101 and the pinned layer 103. Here, the pinned layer 103, whose magnetization orientation is fixed, is so formed as to be thicker than the free layer 101 and serves as a spin filter, i.e. a mechanism for generating the spin-polarized current. A state in which the magnetization orientations of the free layer 101 and the pinned layer 103 are parallel to each other is related to data "0", while a state in which they are anti-parallel to each other is related to data "1".

The spin transfer magnetization switching shown in FIG. 1 is achieved by a CPP (Current Perpendicular to Plane) method, where a write current is injected in a direction perpendicular to the film plane. More specifically, the current is flowed from the pinned layer 103 to the free layer 101 in a transition from data "0" to data "1". In this case, electrons having the same spin state as that of the pinned layer 103 being the spin filter move from the free layer 101 to the pinned layer 103. As a result of the spin transfer (transfer of spin angular momentum) effect, the magnetization of the free layer 101 is switched. On the other hand, the current direction is reversed and the current is flowed from the free layer 101 to the pinned layer 103 in a transition from data "1" to data "0". In this case, electrons having the same spin state as that of the pinned layer 103 being the spin filter move from the pinned layer 103 to the free layer 101. As a result of the spin transfer effect, the magnetization of the free layer 101 is switched.

In this manner, the data writing is performed by transferring the spin electrons in the spin transfer magnetization switching. It is possible to set the magnetization orientation of the free layer 101 depending on the direction of the spin-polarized current perpendicular to the film plane. Here, it is known that the threshold value of the writing (magnetization switching) depends on current density. Therefore, the write current necessary for the magnetization switching decreases with the reduction of the size of the memory cell. Since the write current is decreased with the miniaturization of the memory cell, the spin transfer magnetization switching is important in realizing a large-capacity MRAM.

As a related technique, domain wall motion by the spin transfer in a magnetic substance is described in Japanese Laid-Open Patent Application JP-2006-73930 and Japanese Laid-Open Patent Application JP-2005-191032.

A magnetic memory element described in the Japanese Laid-Open Patent Application JP-2006-73930 is provided with a first magnetic layer, an intermediate layer, and a second magnetic layer. Information is recorded on the basis of a relationship between a magnetization orientation of the first magnetic layer and a magnetization orientation of the second magnetic layer. Here, magnetic domains having magnetizations anti-parallel to each other and a domain wall separating them are steadily formed in at least one of the magnetic layers. By moving the domain wall in the magnetic layer, positions of the adjacent magnetic domains are controlled and information is recorded.

A magnetic storage device described in the Japanese Laid-Open Patent Application JP-2005-191032 is provided with a magnetization fixed layer whose magnetization is fixed, a tunnel insulating layer laminated on the magnetization fixed layer, and a magnetization free layer laminated on the tunnel insulating layer. The magnetization free layer has a connector section overlapping with the tunnel insulating layer and the magnetization fixed layer, constricted sections adjacent to both ends of the connector section, and a pair of magnetization fixed sections respectively formed adjacent to the constricted sections. The magnetization fixed sections are respectively provided with fixed magnetizations whose directions are opposite to each other. The magnetic storage device is further provided with a pair of magnetic information writing terminals which are electrically connected to the pair of magnetization fixed sections. By using the pair of magnetic information writing terminals, a write current penetrating through the connector section, the pair of constricted sections and the pair of magnetization fixed sections of the magnetization free layer is flowed.

Furthermore, the domain wall motion in a magnetic substance is described also in Japanese Laid-Open Patent Application JP-2005-150303, "Yamaguchi et al., PRL, Vol. 92, pp. 077205-1, 2004", and others.

DISCLOSURE OF INVENTION

An object of the present invention is to provide a new MRAM using the domain wall motion caused by the spin transfer.

Another object of the present invention is to provide a technique that can improve mobility of the domain wall in a MRAM using the domain wall motion caused by the spin transfer.

Still another object of the present invention is to provide a technique that can improve both of a write characteristic and a read characteristic of a MRAM using the domain wall motion caused by the spin transfer.

According to the present invention, a MRAM using the domain wall motion caused by the spin transfer (a domain wall motion type MRAM) is provided. The MRAM according to the present invention is provided with: a pinned layer whose magnetization orientation is fixed; and a magnetic recording layer connected to the pinned layer through a first nonmagnetic layer. The magnetic recording layer is provided with a first free layer, a second free layer and a second nonmagnetic layer provided between the first free layer and the second free layer. The second free layer is in contact with the first nonmagnetic layer and has reversible magnetization. That is to say, the pinned layer, the first nonmagnetic layer and the second free layer form a MTJ.

The first free layer includes a magnetization switching region, a first magnetization fixed region and a second magnetization fixed region. The magnetization switching region has reversible magnetization and overlaps the second free layer. The first magnetization fixed region is connected to a first boundary of the magnetization switching region and magnetization orientation thereof is fixed in a first direction. On the other hand, the second magnetization fixed region is connected to a second boundary of the magnetization switching region and magnetization orientation thereof is fixed in a second direction. Both of the first direction and the second direction are directions toward the magnetization switching region or directions away from the magnetization switching region. The magnetization of the magnetization switching region is directed to either the first boundary or the second boundary. Accordingly, a domain wall is formed at either the first boundary or the second boundary in the first free layer.

According to the present invention, the second nonmagnetic layer is so formed as to cover at least the magnetization switching region. Moreover, the magnetization switching region of the first free layer and the second free layer are magnetically coupled to each other through the second nonmagnetic layer. That is to say, when the magnetization orientation of the magnetization switching region is switched, the magnetization orientation of the second free layer also is switched accordingly. Data "0" or data "1" is recorded depending on a relationship between the magnetization orientation of the second free layer and the orientation of the fixed magnetization of the pinned layer. To rewrite the data, the magnetization orientation of the magnetization switching region of the first free layer is switched.

The switching of the magnetization orientation of the magnetization switching region is performed by the spin transfer method. The spin transfer can be achieved by a write current flowing within a plane of the first free layer. The reason is that the first free layer has the above-mentioned structure. In the above-mentioned first free layer, the first magnetization fixed region plays a role of supplying spin electrons of a certain orientation to the magnetization switching region. On the other hand, the second magnetization fixed region plays a role of supplying spin electrons of the opposite orientation to the magnetization switching region. It is thus possible to switch the magnetization orientation of the magnetization switching region to a desired direction, by flowing the write current within the first free layer in a direction depending on the write data.

More specifically, in a first write operation, a first write current is flowed from the first magnetization fixed region to the second magnetization fixed region through the magnetization switching region. Consequently, the spin transfer is performed from the second magnetization fixed region into the magnetization switching region. As a result, the domain wall moves from the second boundary to the first boundary in the magnetization switching region. On the other hand, in a second write operation, a second write current is flowed from the second magnetization fixed region to the first magnetization fixed region through the magnetization switching region. Consequently, the spin transfer is performed from the first magnetization fixed region into the magnetization switching region. As a result, the domain wall moves from the first boundary to the second boundary in the magnetization switching region. In this manner, the data writing is achieved by the domain wall motion.

According to the write method of the present invention, as described above, the write current does not penetrate through the MTJ but flows within the plane of first free layer. Since the write current does not penetrate through the MTJ, deterioration of the first nonmagnetic layer in the MTJ can be suppressed.

Moreover, at the time of the write operation, the domain wall moves in the magnetization switching region of the first free layer, as described above. According to the present invention, the second nonmagnetic layer is so formed as to cover at least the magnetization switching region. This second nonmagnetic layer plays a role of protecting the magnetization switching region from damages due to oxidation and etching during a manufacturing process. If there is not the second nonmagnetic layer covering the magnetization switching region, a surface of the magnetization switching region is damaged by reactive gas, ions, radicals and the like during the etching. Then, the domain wall cannot smoothly move in the magnetization switching region. However, according to the present invention, the magnetization switching region is protected from the damages by the second nonmagnetic layer. Therefore, the domain wall motion in the magnetization switching region can be smoothly performed, namely, mobility of the domain wall is improved. As a result, reliability and yield of the domain wall motion type MRAM are improved.

Furthermore, according to the present invention, the magnetic recording layer has the first free layer and the second free layer separately. Among them, the first free layer is a domain wall motion layer and thus greatly contributes to write characteristics (e.g., magnitude of the write current and the like). On the other hand, the second free layer being in contact with the first nonmagnetic layer is a layer constituting the MTJ together with the pinned layer and thus greatly contributes to read characteristics (e.g., a MR ratio and the like). It is therefore possible according to the structure of the present invention to control the write characteristic and the read characteristic independently of each other.

For example, in the case of the spin transfer method, the write current required for the magnetization switching decreases as saturation magnetization of a magnetic layer becomes smaller. Whereas, when the saturation magnetization of the magnetic layer is decreased, polarizability of the magnetic layer is lowered. In this case, the TMR effect is decreased and hence the MR ratio is lowered. That is to say, there is in general a trade-off relationship between improvement in the MR ratio and reduction in the write current. However, according to the present invention, the first free layer and the second free layer can be designed independently of each other. Accordingly, it is possible to design the saturation magnetization of the first free layer to be comparatively small while to design the saturation magnetization of the second free layer to be comparatively large. As a result, increase in the MR ratio (read margin) and reduction in the write current can be achieved at the same time.

According to the present invention, as described above, it is possible to control the respective characteristics of the first free layer and the second free layer freely and independently of each other. This means improvement in device design freedom, which enables improvement in both of the write characteristic and the read characteristic. This merit cannot be obtained by the CPP spin transfer method. The reason is that both of the write characteristic and the read characteristic are subject to a ferromagnetic layer adjacent to a tunnel barrier layer, in the case of the CPP spin transfer method. Moreover, even in a case of the spin transfer method based on a planar write current, the above-described merit cannot be obtained if only one free layer is used (i.e., if the second free layer does not exist). The reason is that a first free layer, where the domain wall moves, simultaneously serves as one end of the MTJ and thus affects not only the write characteristic but also the read characteristic.

According to the present invention, the domain wall motion type MRAM using the domain wall motion caused by the spin transfer is provided. In a manufacturing process of the domain wall motion type MRAM, damages to the domain wall motion layer in which the domain wall moves are prevented. Therefore, the domain wall motion can be smoothly performed in the domain wall motion layer, namely, the mobility of the domain wall is improved. As a result, the reliability and yield of the domain wall motion type MRAM are improved. Furthermore, according to the domain wall motion type MRAM of the present invention, the increase in the read margin and the reduction in the write current can be achieved at the same time. That is, it is possible to improve both of the write characteristic and the read characteristic.

BEST MODE FOR CARRYING OUT THE INVENTION

A MRAM and a method of manufacturing the same according to an exemplary embodiment of the present invention will be described with reference to the attached drawings. The MRAM according to the present exemplary embodiment is a "domain wall motion type MRAM" using domain wall motion caused by spin transfer. The MRAM according to the present exemplary embodiment has a plurality of magnetic memory cells arranged in an array form, and each of the magnetic memory cells has a MTJ.

1. Entire Structure of Magnetic Memory Cell

Figure 1:
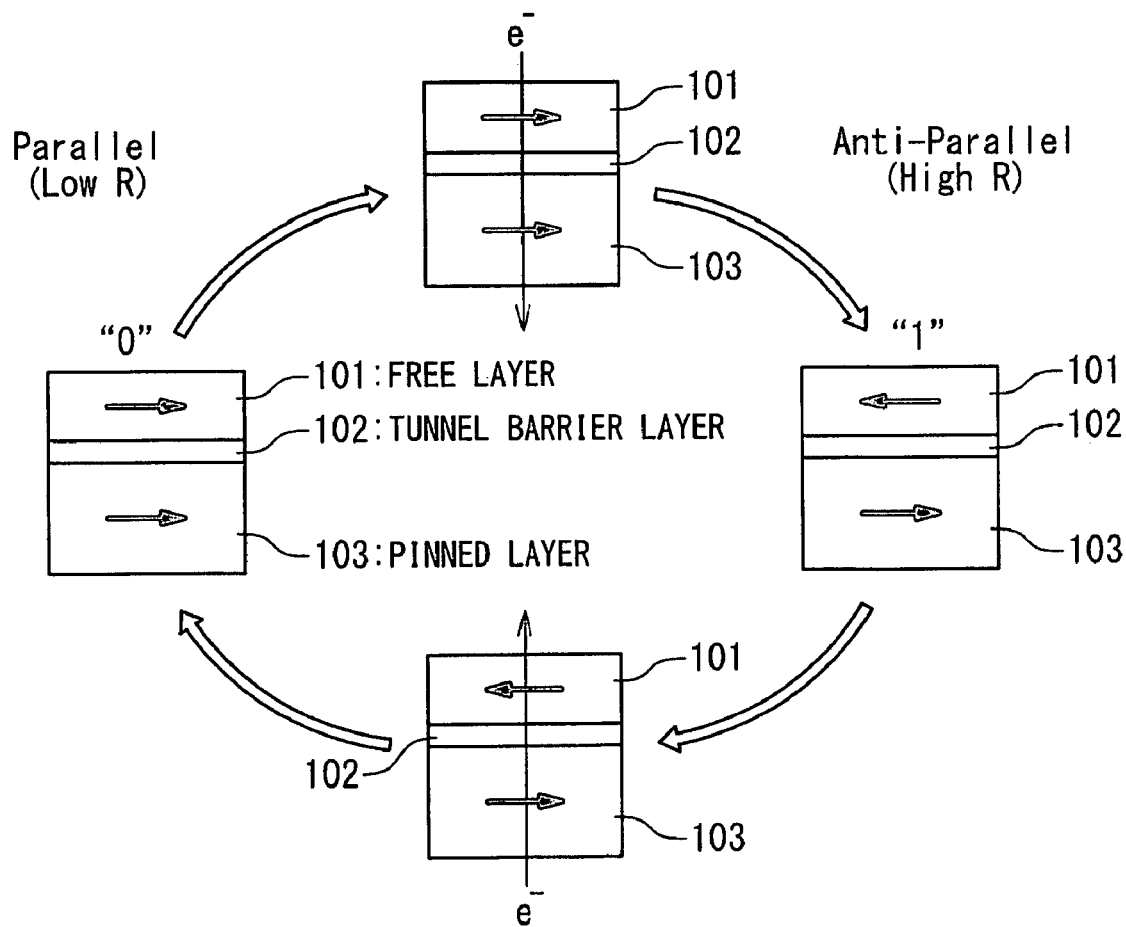
FIG. 1 is a diagram for explaining data writing according to a spin transfer method.
Figure 2:
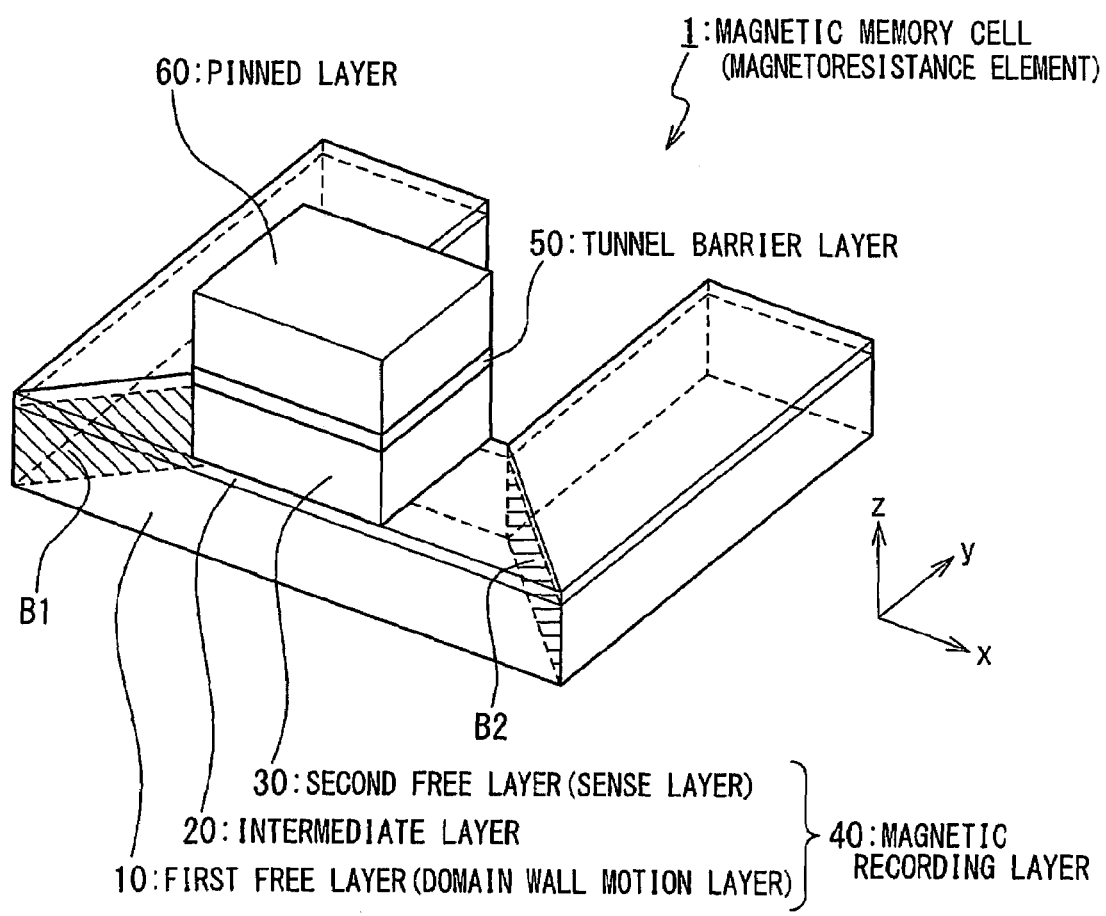
FIG. 2 is a perspective view showing one example of a structure of a magnetic memory cell according to an exemplary embodiment of the present invention.

FIG. 2 shows one example of a structure of a magnetic memory cell 1 (magnetoresistance element) according to the present exemplary embodiment. The magnetic memory cell 1 is provided with a magnetic recording layer 40, a tunnel barrier layer 50 and a pinned layer 60. The tunnel barrier layer 50 is sandwiched between the magnetic recording layer 40 and the pinned layer 60.

The pinned layer 60 is a ferromagnetic layer and magnetization orientation thereof is fixed. More specifically, the pinned layer 60 includes a ferromagnetic film that is adjacent to the tunnel barrier layer 50, and magnetization orientation of the ferromagnetic film is substantially fixed in one direction. For example, the pinned layer 60 includes a CoFe film as the ferromagnetic film. For example, the pinned layer 60 is a laminated film made of CoFe/Ru/CoFe/PtMn.

The tunnel barrier layer 50 is a nonmagnetic layer. For example, the tunnel barrier layer 50 is a thin insulating film. As the insulating film, a $Al_2O_3$ film, a $SiO_2$ film, a MgO film and a AlN film are exemplified. Besides, nonmagnetic metal such as Cu, Zn, Au, Ag and Al can be used as the tunnel barrier layer 50.

The magnetic recording layer 40 is connected to the pinned layer 60 through the tunnel barrier layer 50. More specifically, the magnetic recording layer 40 includes a first free layer 10, an intermediate layer 20 and a second free layer 30. The intermediate layer 20 is provided between the first free layer 10 and the second free layer 30. Among these, the second free layer 30 is in contact with the tunnel barrier layer 50.

The first free layer 10 and the second free layer 30 are ferromagnetic layers and have reversible magnetization. The first free layer 10 and the second free layer 30 are formed of ferromagnetic metal such as NiFe, CoFe, NiFeCo and the like. The first free layer 10 and the second free layer 30 may include nonmagnetic element such as B, C, O, Zr and the like as additive.

The intermediate layer 20 is a nonmagnetic layer and is formed of nonmagnetic metal such as Ru, Cu, Ir, Rh and the like. In the present exemplary embodiment, the intermediate layer 20 is formed on the first free layer 10 so as to cover at least a part of the first free layer 10. The intermediate layer 20 plays a role of protecting the first free layer 10 from damages caused by oxidation and etching during a manufacturing process described later. It is therefore preferable that the intermediate layer 20 is so formed as to entirely cover the first free layer 10. In other words, it is preferable that the intermediate layer 20 has the same shape in an XY plane as that of the first free layer 10.

The first free layer 10 and the second free layer 30 are magnetically coupled to each other through the intermediate layer 20. As the magnetic coupling, anti-ferromagnetic coupling, ferromagnetic coupling and static coupling are exemplified. The type of the magnetic coupling is determined by adjusting a thickness of the intermediate layer 20. When a magnetization orientation of the first free layer 10 is changed, a magnetization orientation of the second free layer 30 also is changed accordingly, because the first free layer 10 and the second free layer 30 are magnetically coupled to each other.

As described above, the second free layer 30 is in contact with the tunnel barrier layer 50. That is, the second free layer 30, the tunnel barrier layer 50 and the pinned layer 60 form a MTJ. Data recorded in the magnetic memory cell 1 can be read by detecting a resistance value of the MTJ. In that sense, the second free layer 30 may be referred to as a "sense layer". The second free layer 30 as the sense layer greatly contributes to read characteristics (e.g., a MR ratio) of the magnetic memory cell 1.

Meanwhile, data writing is performed by switching the magnetization orientation of the second free layer 30. To change the magnetization orientation of the second free layer 30, the magnetization of the first free layer 10 is switched. As described in the following section, the first free layer 10 according to the present exemplary embodiment has a domain wall, and the magnetization switching in the first free layer 10 is achieved by moving the domain wall. In that sense, the first free layer 10 may be referred to as a "domain wall motion layer". The first free layer 10 plays a role of switching the magnetization of the second free layer 30 and thus greatly contributes to write characteristics (e.g., magnitude of a write current). The first free layer 10 as the domain wall motion layer will be described below in more detail.

2. Domain Wall Motion Layer

2-1. Structural Example 1

Figure 3:
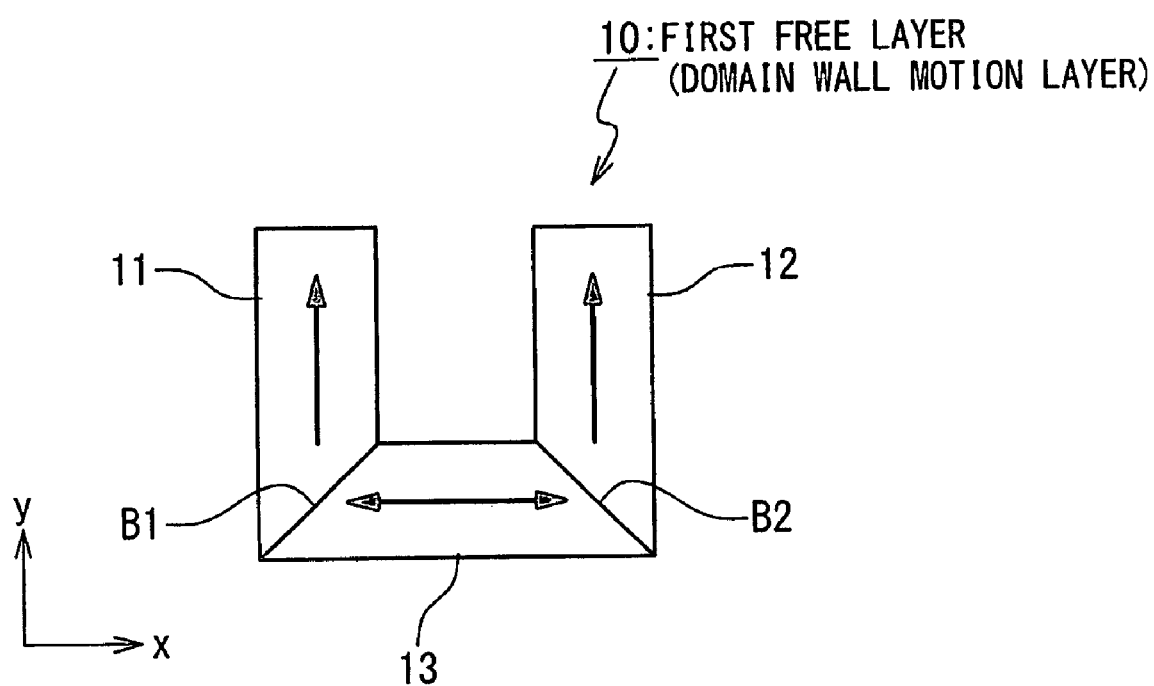
FIG. 3 is a plan view showing one example of a domain wall motion layer according to the exemplary embodiment of the present invention.

FIG. 3 is a plan view showing one example of a structure of the first free layer 10 according to the present exemplary embodiment. As shown in FIG. 3, the first free layer 10 includes three different regions; a first magnetization fixed region 11, a second magnetization fixed region 12 and a magnetization switching region 13. The first magnetization fixed region 11, the second magnetization fixed region 12 and the magnetization switching region 13 are formed in the same plane (the XY plane). The first magnetization fixed region 11 and the second magnetization fixed region 12 are so formed as to extend in the Y direction. On the other hand, the magnetization switching region 13 is so formed as to extend in the X direction and connects between the first magnetization fixed region 11 and the second magnetization fixed region 12. The first magnetization fixed region 11 and the magnetization switching region 13 are connected to each other at a first boundary B1, while the second magnetization fixed region 12 and the magnetization switching region 13 are connected to each other at the opposed second boundary B2. In other words, the first and second magnetization fixed regions 11 and 12 and the magnetization switching region 13 in FIG. 3 are formed to be "U-shaped" or "concave-shaped".

The magnetization orientation in each region is also indicated by an arrow in FIG. 3.

Magnetization orientations of the first magnetization fixed region 11 and the second magnetization fixed region 12 are fixed. More specifically, the magnetization orientation of the first magnetization fixed region 11 is fixed in the +Y direction. The direction is away from the first boundary B1. Also, the magnetization orientation of the second magnetization fixed region 12 is fixed in the +Y direction. The direction is away from the second boundary B2. That is to say, the first magnetization fixed region 11 and the second magnetization fixed region 12 both are formed such that their magnetization orientations are away from the magnetization switching region 13. This means that the magnetization orientation of the first magnetization fixed region 11 and the magnetization orientation of the second magnetization fixed region 12 are opposite to each other along the shape of the first free layer 10.

Meanwhile, the magnetization orientation of the magnetization switching region 13 is reversible and can be in the +X direction or the −X direction. In a case where the magnetization orientation of the magnetization switching region 13 is the +X direction, namely, where the magnetization is directed to the second boundary B2, the first magnetization fixed region 11 forms one magnetic domain while the magnetization switching region 13 and the second magnetization fixed region 12 form another magnetic domain. That is, a "domain wall" is formed at the first boundary B1. On the other hand, in a case where the magnetization orientation of the magnetization switching region 13 is the −X direction, namely, where the magnetization is directed to the first boundary B1, the first magnetization fixed region 11 and the magnetization switching region 13 form one magnetic domain while the second magnetization fixed region 12 forms another magnetic domain. That is, the domain wall is formed at the second boundary B2.

According to the present exemplary embodiment, the magnetization switching region 13 overlaps the above-mentioned second free layer 30. Moreover, the magnetization switching region 13 and the second free layer 30 are magnetically coupled to each other through the intermediate layer 20. That is to say, when the magnetization orientation of the magnetization switching region 13 is switched, the magnetization orientation of the second free layer 30 also is switched accordingly. Data "0" or data "1" is recorded depending on a relationship between the magnetization orientation of the second free layer 30 and the orientation of the fixed magnetization of the pinned layer 60. To rewrite the data, the magnetization orientation of the magnetization switching region 13 is switched.

Figure 4:
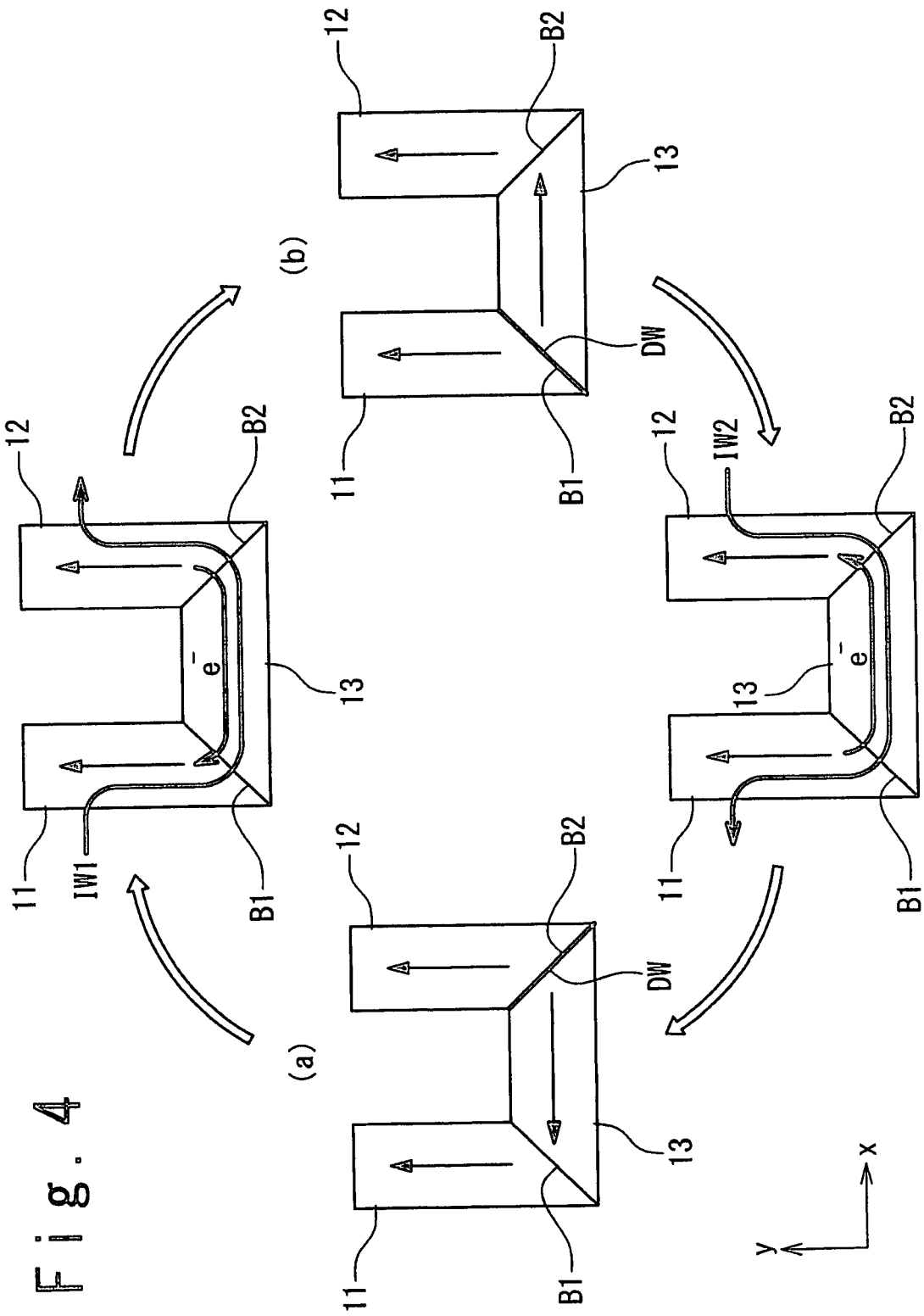
FIG. 4 is a schematic diagram showing domain wall motion in the domain wall motion layer shown in FIG. 3.

The switching of the magnetization orientation of the magnetization switching region 13, namely, the data writing is performed by the spin transfer method. Principle of the data writing will be explained below with reference to FIG. 4. As shown in FIG. 4, in a case of a state (a), the magnetization orientation of the magnetization switching region 13 is the −X direction and the domain wall DW exists at the second boundary B2. On the other hand, in a case of a state (b), the magnetization orientation of the magnetization switching region 13 is the +X direction and the domain wall DW exists at the first boundary B1.

In a case of transition from the state (a) to the state (b), a first write current IW1 flows from the first magnetization fixed region 11 to the second magnetization fixed region 12 through the magnetization switching region 13. In this case, electrons (spin electrons) are injected into the magnetization switching region 13 from the second magnetization fixed region 12. The spin of the injected electrons affects magnetic moment of the magnetization switching region 13. As a result, the magnetization orientation of the magnetization switching region 13 is switched to a direction toward the second boundary B2. In other words, the magnetization of the magnetization switching region 13 is reversed due to the spin transfer effect and the orientation of the magnetization is changed to the +X direction (i.e., the spin transfer magnetization switching). Note in this case that the domain wall DW moves from the second boundary B2 to the first boundary B1 within the magnetization switching region 13 in accordance with the electron movement direction.

On the other hand, in a case of transition from the state (b) to the state (a), a second write current IW2 flows from the second magnetization fixed region 12 to the first magnetization fixed region 11 through the magnetization switching region 13. In this case, electrons are injected into the magnetization switching region 13 from the first magnetization fixed region 11. As a result, the magnetization of the magnetization switching region 13 is reversed and the orientation of the magnetization is changed to be the −X direction. Note in this case that the domain wall DW moves from the first boundary B1 to the second boundary B2 within the magnetization switching region 13 in accordance with the electron movement direction.

In this manner, the magnetization switching caused by the spin transfer is achieved. The first magnetization fixed region 11 plays a role of supplying spin electrons of a certain orientation to the magnetization switching region 13. On the other hand, the second magnetization fixed region 12 plays a role of supplying spin electrons of the opposite orientation to the magnetization switching region 13. It is thus possible to switch the magnetization orientation of the magnetization switching region 13 to a desired direction, by flowing the write current within the first free layer 10 in a direction depending on the write data. This can also be described in terms of the "Domain Wall Motion". That is, the domain wall DW included in the first free layer 10 moves back and forth between the first boundary B1 and the second boundary B2 like a "seesaw or flowmeter" in accordance with the electron movement direction. The domain wall DW moves within the magnetization switching region 13, and thus the magnetization switching region 13 can be referred to as a "domain wall motion region". It can also be said that the magnetic memory cell 1 according to the present exemplary embodiment stores data on the basis of a position of the domain wall DW.

It should be noted here that the spin transfer is achieved by the current flowing within the plane of the first free layer 10. That is, it is not necessary in the write operation to supply a write current that penetrates through the MTJ. In the present exemplary embodiment, the write currents IW1 and IW2 do not penetrate through the MTJ but flows within the plane of the first free layer 10. Since the write currents IW1 and IW2 do not penetrate through the MTJ, deterioration of the tunnel barrier layer 50 in the MTJ can be suppressed.

2-2. Structural Example 2

Figure 5:
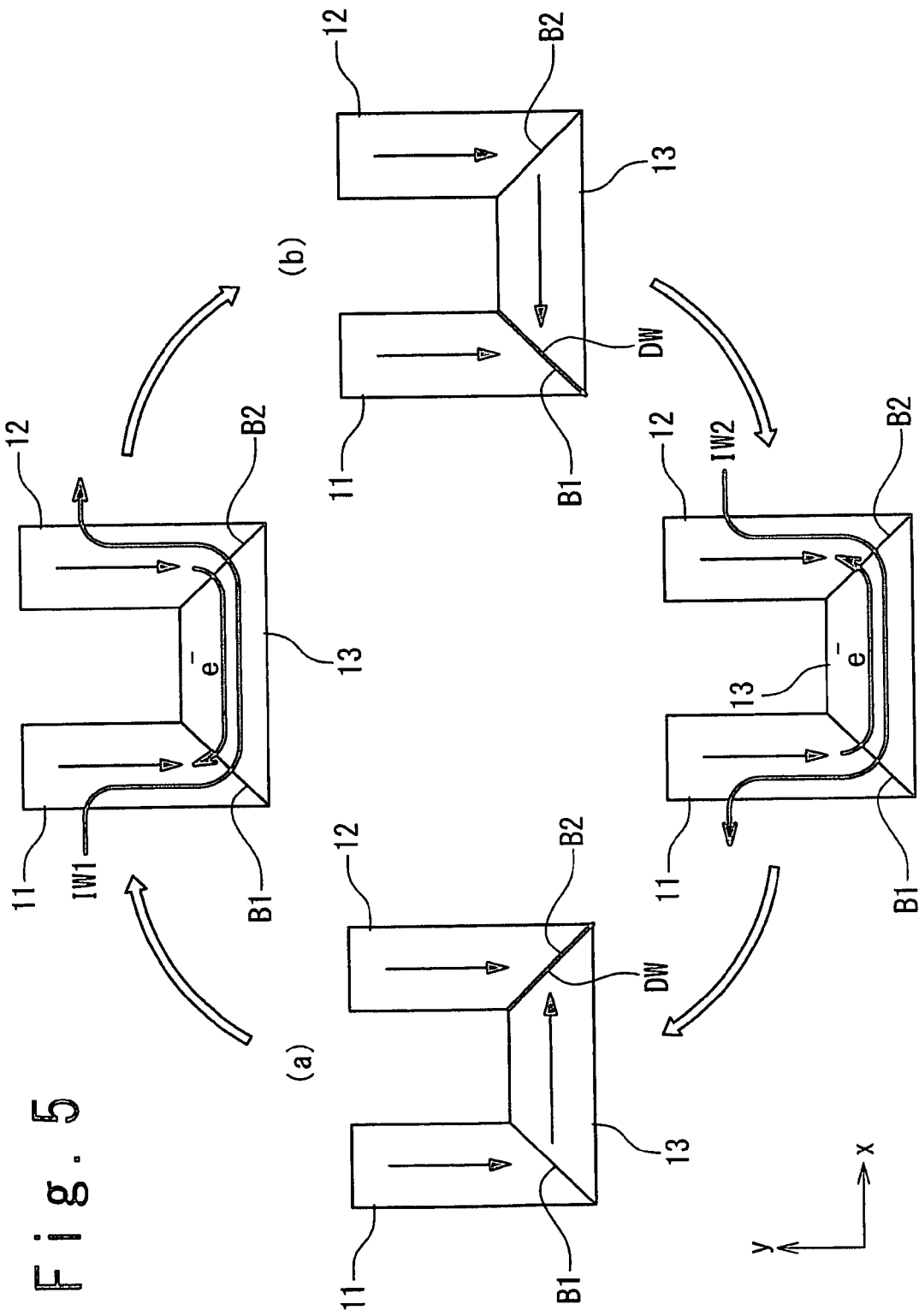
FIG. 5 is a schematic diagram showing another example of the domain wall motion layer and domain wall motion in the domain wall motion layer according to the exemplary embodiment of the present invention.

The magnetization orientations of the first magnetization fixed region 11 and the second magnetization fixed region 12 are not limited to those shown in FIGS. 3 and 4. The magnetization orientation of the first magnetization fixed region 11 and the magnetization orientation of the second magnetization fixed region 12 just need to be opposite along the shape of the first free layer 10. FIG. 5 shows another example of the first free layer 10. FIG. 5 is a diagram similar to FIG. 4, and overlap description will be omitted appropriately.

In FIG. 5, the magnetization orientation of the first magnetization fixed region 11 is fixed in the −Y direction. The direction is toward the first boundary B1. Also, the magnetization orientation of the second magnetization fixed region 12 is fixed in the −Y direction. The direction is toward the second boundary B2. That is to say, the magnetization of the first magnetization fixed region 11 and the magnetization of the second magnetization fixed region 12 are fixed in the directions toward the magnetization switching region 13 and are directed to opposite directions along the shape of the first free layer 10. In a case of a state (a), the magnetization orientation of the magnetization switching region 13 is the +X direction and the domain wall DW exists at the second boundary B2. On the other hand, in a case of a state (b), the magnetization orientation of the magnetization switching region 13 is the −X direction and the domain wall DW exists at the first boundary B1.

In a case of transition from the state (a) to the state (b), a first write current IW1 flows from the first magnetization fixed region 11 to the second magnetization fixed region 12 through the magnetization switching region 13. In this case, electrons are injected into the magnetization switching region 13 from the second magnetization fixed region 12. As a result, the magnetization of the magnetization switching region 13 is reversed and the orientation of the magnetization is changed to the −X direction. The domain wall DW moves from the second boundary B2 to the first boundary B1 in accordance with the electron movement direction. On the other hand, in a case of transition from the state (b) to the state (a), a second write current IW2 flows from the second magnetization fixed region 12 to the first magnetization fixed region 11 through the magnetization switching region 13. In this case, electrons are injected into the magnetization switching region 13 from the first magnetization fixed region 11. As a result, the magnetization of the magnetization switching region 13 is reversed and the orientation of the magnetization is changed to be the +X direction. The domain wall DW moves from the first boundary B1 to the second boundary B2 within the magnetization switching region 13 in accordance with the electron movement direction.

2-3. Structural Example 3

Figure 6:
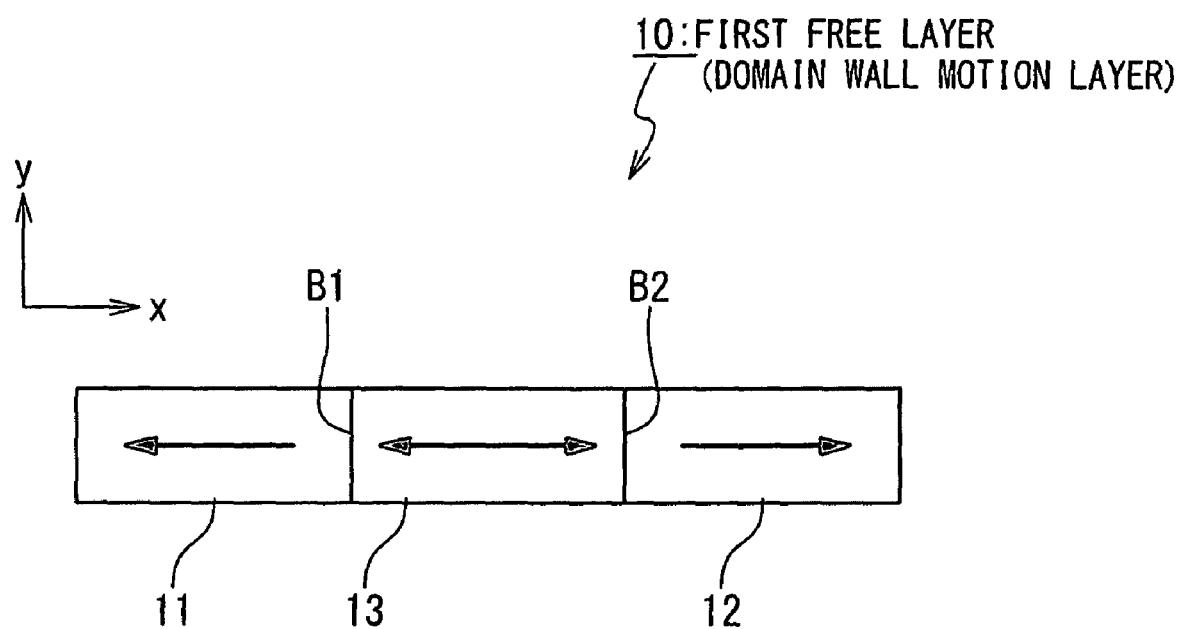
FIG. 6 is a plan view showing further another example of the domain wall motion layer according to the exemplary embodiment of the present invention.

A planar shape of the first free layer 10 is not limited to that described above. FIG. 6 is a plan view showing further another example of the structure of the first free layer 10. In FIG. 6, the first and second magnetization fixed regions 11 and 12 and the magnetization switching region 13 are formed "linearly" along the X direction. The magnetization orientation of the first magnetization fixed region 11 is fixed in the −X direction. The direction is away from the first boundary B1. The magnetization orientation of the second magnetization fixed region 12 is fixed in the +X direction. The direction is away from the second boundary B2. That is to say, the magnetization of the first magnetization fixed region 11 and the magnetization of the second magnetization fixed region 12 are both fixed in the directions away from the magnetization switching region 13 and are directed to the opposite directions. The magnetization orientation of the magnetization switching region 13 is reversible and can be the +X direction or the −X direction.

Figure 7:
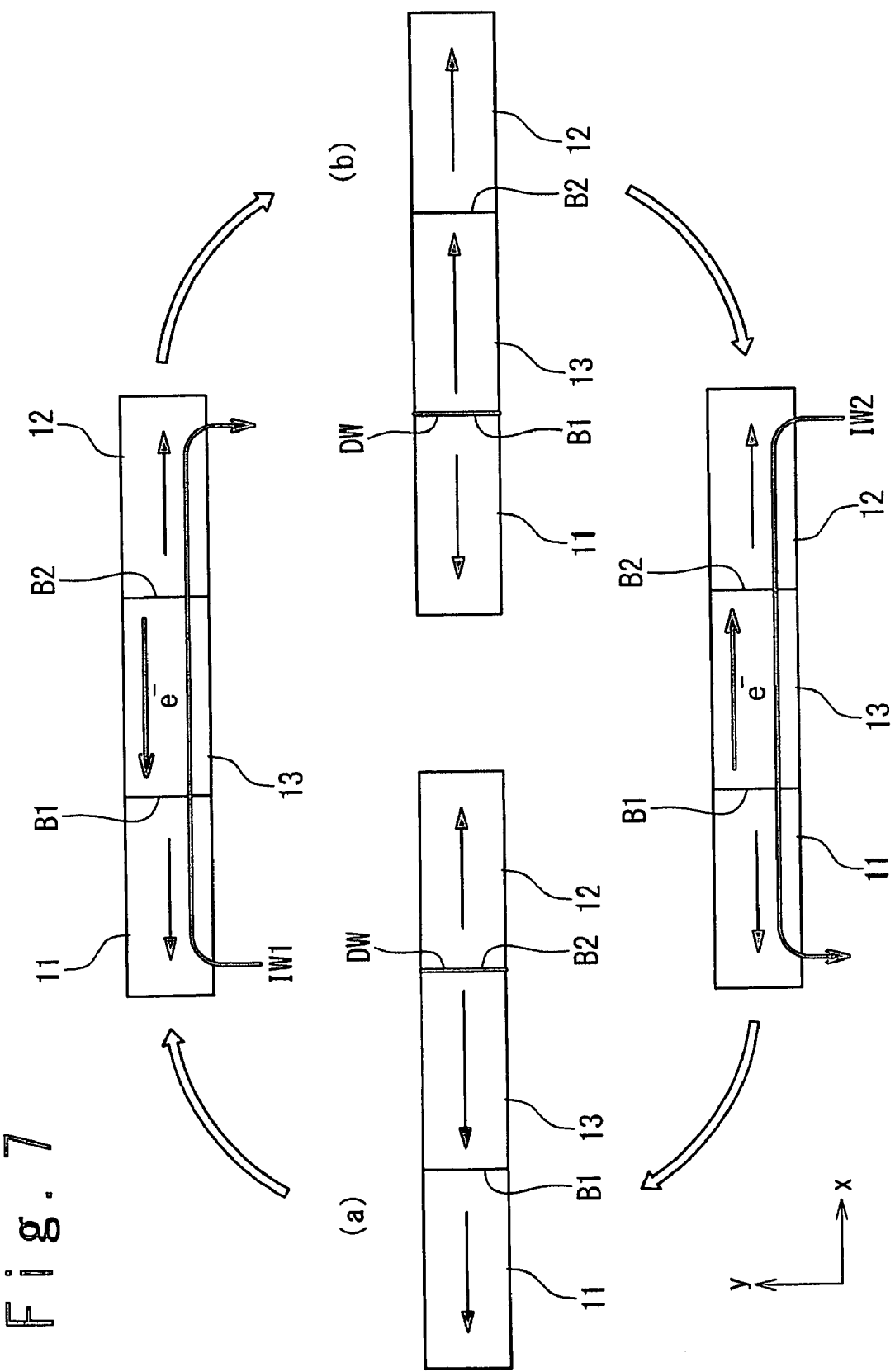
FIG. 7 is a schematic diagram showing domain wall motion in the domain wall motion shown in FIG. 6.

FIG. 7 shows the magnetization switching in the magnetization switching region 13. In a state (a), the magnetization orientation of the magnetization switching region 13 is the −X direction and the domain wall DW exists at the second boundary B2. On the other hand, in a state (b), the magnetization orientation of the magnetization switching region 13 is the +X direction and the domain wall DW exists at the first boundary B1.

In a case of transition from the state (a) to the state (b), a first write current IW1 flows from the first magnetization fixed region 11 to the second magnetization fixed region 12 through the magnetization switching region 13. In this case, electrons are injected into the magnetization switching region 13 from the second magnetization fixed region 12. As a result, the magnetization of the magnetization switching region 13 is reversed and the orientation of the magnetization is changed to the +X direction. The domain wall DW moves from the second boundary B2 to the first boundary B1 in accordance with the electron movement direction. On the other hand, in a case of transition from the state (b) to the state (a), a second write current IW2 flows from the second magnetization fixed region 12 to the first magnetization fixed region 11 through the magnetization switching region 13. In this case, electrons are injected into the magnetization switching region 13 from the first magnetization fixed region 11. As a result, the magnetization of the magnetization switching region 13 is reversed and the orientation of the magnetization is changed to the −X direction. The domain wall DW moves from the first boundary B1 to the second boundary B2 in accordance with the electron movement direction.

2-4. Structural Example 4

Figure 8:
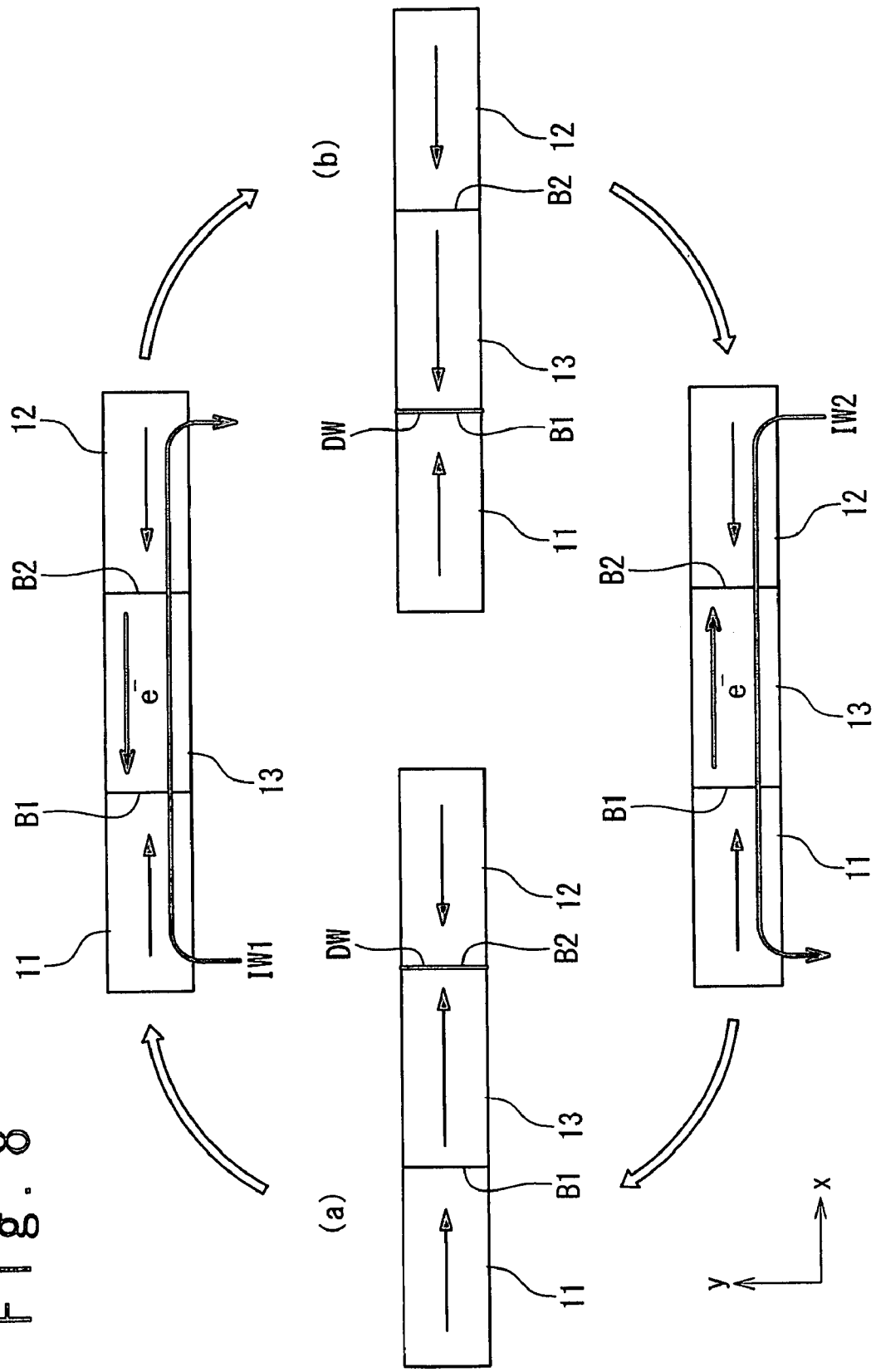
FIG. 8 is a schematic diagram showing further another example of the domain wall motion layer and domain wall motion in the domain wall motion layer according to the exemplary embodiment of the present invention.

FIG. 8 shows further another example of the first free layer 10. FIG. 8 is a diagram similar to FIG. 7, and overlap description will be omitted appropriately.

In FIG. 8, the magnetization orientation of the first magnetization fixed region 11 is fixed in the +X direction. The direction is toward the first boundary B1. The magnetization orientation of the second magnetization fixed region 12 is fixed in the −X direction. The direction is toward the second boundary B2. That is to say, the magnetization of the first magnetization fixed region 11 and the magnetization of the second magnetization fixed region 12 are both fixed in the directions toward the magnetization switching region 13 and are directed to the opposite directions. In a state (a), the magnetization orientation of the magnetization switching region 13 is the +X direction and the domain wall DW exists at the second boundary B2. On the other hand, in a state (b), the magnetization orientation of the magnetization switching region 13 is the −X direction and the domain wall DW exists at the first boundary B1.

In a case of transition from the state (a) to the state (b), a first write current IW1 flows from the first magnetization fixed region 11 to the second magnetization fixed region 12 through the magnetization switching region 13. In this case, electrons are injected into the magnetization switching region 13 from the second magnetization fixed region 12. As a result, the magnetization of the magnetization switching region 13 is reversed and the orientation of the magnetization is changed to the −X direction. The domain wall DW moves from the second boundary B2 to the first boundary B1 in accordance with the electron movement direction. On the other hand, in a case of transition from the state (b) to the state (a), a second write current IW2 flows from the second magnetization fixed region 12 to the first magnetization fixed region 11 through the magnetization switching region 13. In this case, electrons are injected into the magnetization switching region 13 from the first magnetization fixed region 11. As a result, the magnetization of the magnetization switching region 13 is reversed and the orientation of the magnetization is changed to the +X direction. The domain wall DW moves from the first boundary B1 to the second boundary B2 in accordance with the electron movement direction.

2-5. Magnetization Fixation

Various methods can be considered for fixing the magnetizations of the magnetization fixed regions 11 and 12. For example, pinning layers (not shown) made of magnetic substance are provided near the magnetization fixed regions 11 and 12. The magnetizations are fixed by static coupling between the pinning layers and the magnetization fixed regions 11 and 12. The pinning layers may be provided so as to be attached firmly to the magnetization fixed regions 11 and 12. In this case, the magnetizations are fixed by exchange coupling.

Alternatively, the magnetizations may be fixed by using magnetic anisotropy. For example, in the case of the structures shown in FIGS. 3 to 5, longitudinal directions of the first magnetization fixed region 11 and the second magnetization fixed region 12 are the Y direction and a longitudinal direction of the magnetization switching region 13 is the X direction. Accordingly, the magnetization fixed regions 11 and 12 have magnetic anisotropy in the same direction, and the magnetization switching region 13 has magnetic anisotropy in a direction different from that of the magnetization fixed regions 11 and 12. Therefore, a magnetic field in the +Y direction or the −Y direction is applied in an initial annealing process. As a result, the magnetization orientations of the magnetization fixed regions 11 and 12 are held in the +Y direction or the −Y direction due to the magnetic anisotropy. In this case, there is no need to provide the pinning layers, which is preferable. That is to say, the "U-shape" shown in FIGS. 3 to 5 is a preferable shape from the viewpoint of the magnetization fixation.

3. Magnetic Recording Layer

In the magnetic recording layer 40 according to the present exemplary embodiment, the magnetization switching region 13 of the first free layer 10 and the second free layer 30 are magnetically coupled to each other through the intermediate layer 20. As the magnetic coupling, anti-ferromagnetic coupling, ferromagnetic coupling and static coupling are exemplified. The type of the magnetic coupling is determined by adjusting a thickness of the intermediate layer 20.

3-1. Anti-Ferromagnetic Coupling

Figure 9:
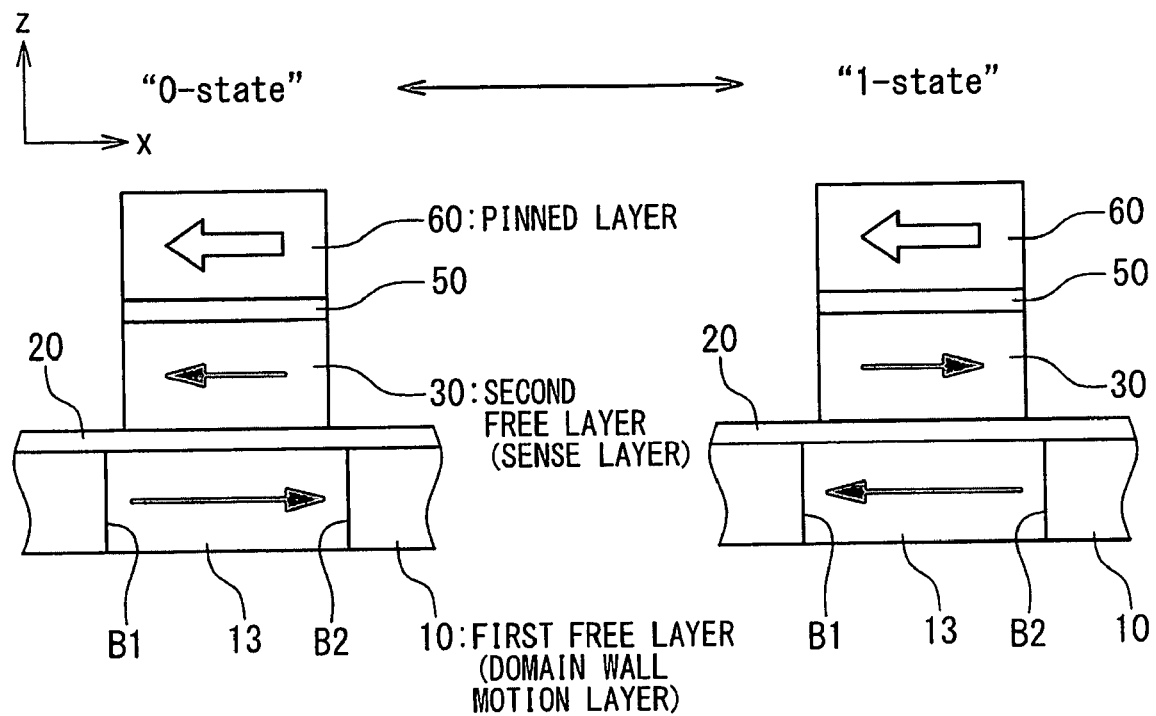
FIG. 9 is a side view showing one example of the structure of the magnetic memory cell according to the exemplary embodiment of the present invention.

FIG. 9 is a side view schematically showing the magnetic memory cell 1 in the case of the anti-ferromagnetic coupling. In FIG. 9, the magnetization switching region 13 and the second free layer 30 are anti-ferromagnetically coupled to each other through the intermediate layer 20. Therefore, the magnetization orientation of the second free layer 30 becomes opposite to the magnetization orientation of the magnetization switching region 13.

In FIG. 9, the magnetization orientation of the pinned layer 60 is fixed in the −X direction. The data "0" is related to a case where the magnetization orientation of the second free layer 30 is the −X direction. In this case, the magnetization orientation of the magnetization switching region 13 is the +X direction. On the other hand, the data "1" is related to a case where the magnetization orientation of the second free layer 30 is the +X direction. In this case, the magnetization orientation of the magnetization switching region 13 is the −X direction. The resistance value of the MTJ is larger in the case of data "1" than in the case of data "0".

At the time of data writing, the write current is flowed within the plane of the first free layer 10. As a result, the magnetization orientation of the magnetization switching region 13 is switched as described in the second section. The magnetization orientation of the second free layer 30 is also switched in accordance with that. At the time of data reading, a read current is supplied so as to flow between the pinned layer 60 and the second free layer 30. For example, the read current is flowed from the pinned layer 60 to either the first magnetization fixed region 11 or the second magnetization fixed region 12 through the tunnel barrier layer 50, the second free layer 30, the intermediate layer 20 and the magnetization switching region 13. Based on the read current or a read electric potential, the resistance value of the MTJ is detected and the magnetization orientation of the second free layer 30 (sense layer) is sensed.

3-2. Ferromagnetic Coupling

Figure 10:
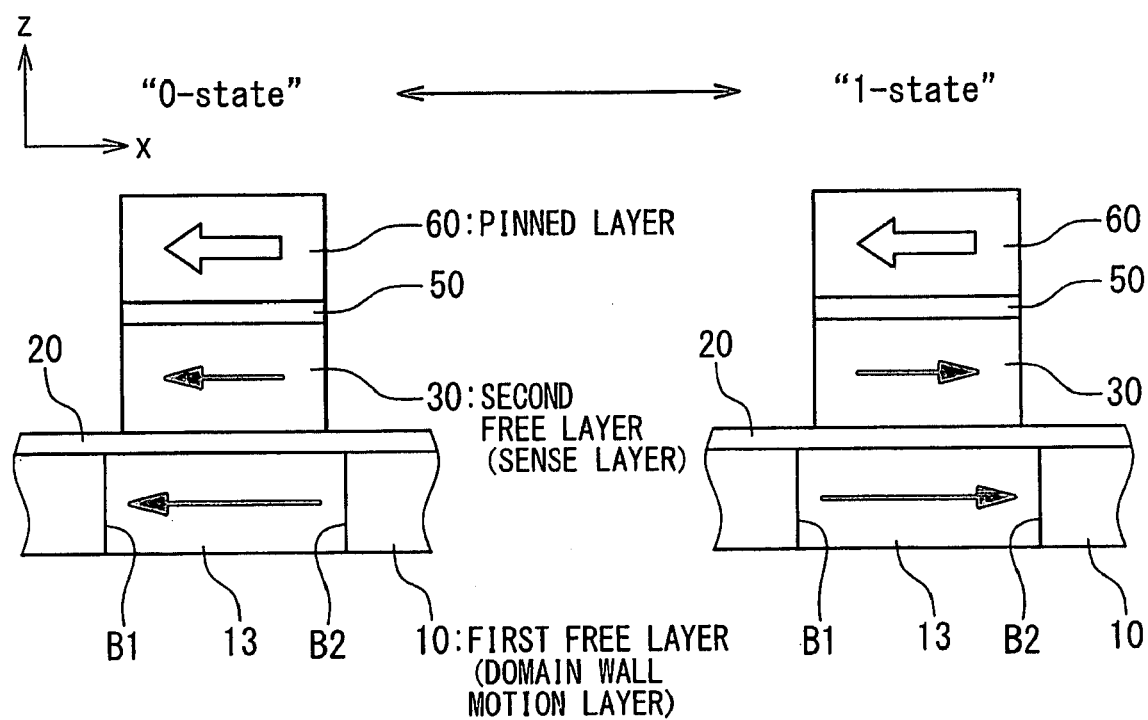
FIG. 10 is a side view showing another example of the structure of the magnetic memory cell according to the exemplary embodiment of the present invention.

FIG. 10 is a side view schematically showing the magnetic memory cell 1 in the case of the ferromagnetic coupling. In FIG. 10, the magnetization switching region 13 and the second free layer 30 are ferromagnetically coupled to each other through the intermediate layer 20. Therefore, the magnetization orientation of the second free layer 30 becomes the same as the magnetization orientation of the magnetization switching region 13.

In FIG. 10, the magnetization orientation of the pinned layer 60 is fixed in the −X direction. The data "0" is related to a case where the magnetization orientation of the second free layer 30 is the −X direction. In this case, the magnetization orientation of the magnetization switching region 13 is the −X direction. On the other hand, the data "1" is related to a case where the magnetization orientation of the second free layer 30 is the +X direction. In this case, the magnetization orientation of the magnetization switching region 13 is the +X direction. The resistance value of the MTJ is larger in the case of data "1" than in the case of data "0".

At the time of data writing, the write current is flowed within the plane of the first free layer 10. As a result, the magnetization orientation of the magnetization switching region 13 is switched as described in the second section. The magnetization orientation of the second free layer 30 is also switched in accordance with that. The data reading is performed in a similar manner to the above-mentioned method.

3-3. Static Coupling

Figure 11:
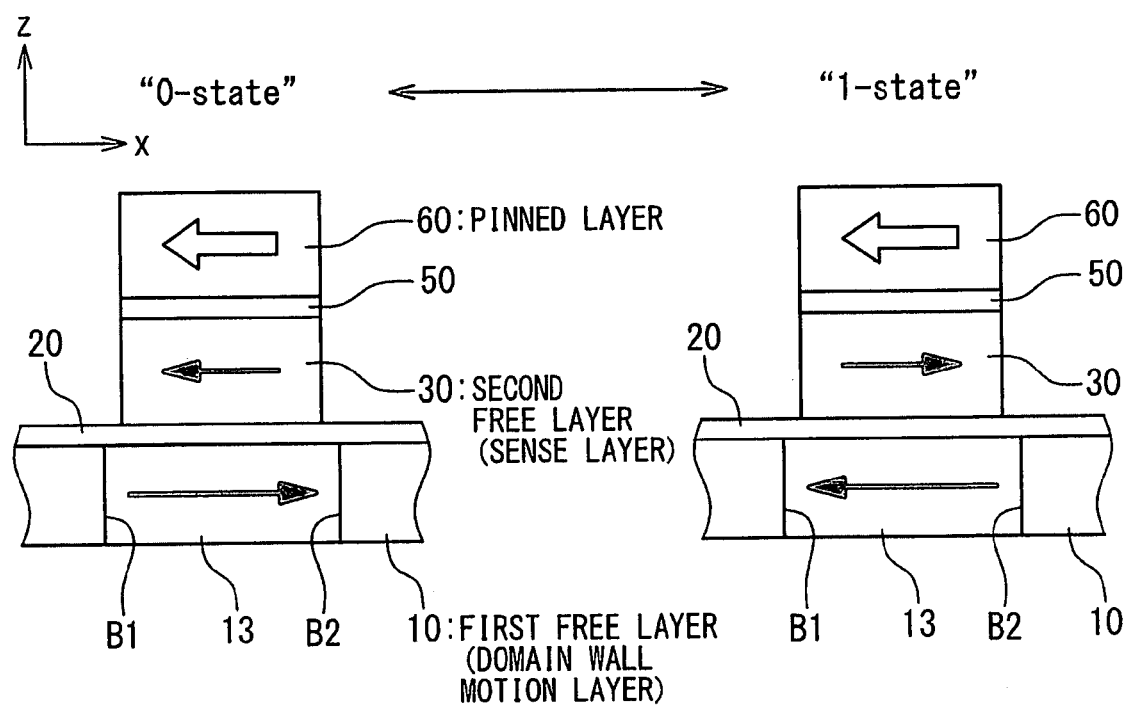
FIG. 11 is a side view showing further another example of the structure of the magnetic memory cell according to the exemplary embodiment of the present invention.

FIG. 11 is a side view schematically showing the magnetic memory cell 1 in the case of the magneto-static coupling. In FIG. 11, the magnetization switching region 13 and the second free layer 30 are neither anti-ferromagnetically coupled nor ferromagnetically coupled. The magnetization switching region 13 and the second free layer 30 are magnetically coupled to each other by a leakage magnetic field from the domain wall. Thus, the magnetization orientation of the second free layer 30 becomes opposite to the magnetization orientation of the magnetization switching region 13.

In FIG. 11, the magnetization orientation of the pinned layer 60 is fixed in the −X direction. The data "0" is related to a case where the magnetization orientation of the second free layer 30 is the −X direction. In this case, the magnetization orientation of the magnetization switching region 13 is the +X direction. On the other hand, the data "1" is related to a case where the magnetization orientation of the second free layer 30 is the +X direction. In this case, the magnetization orientation of the magnetization switching region 13 is the −X direction. The resistance value of the MTJ is larger in the case of data "1" than in the case of data "0".

At the time of data writing, the write current is flowed within the plane of the first free layer 10. As a result, the magnetization orientation of the magnetization switching region 13 is switched as described in the second section. The magnetization orientation of the second free layer 30 is also switched in accordance with that. The data reading is performed in a similar manner to the above-mentioned method.

4. Manufacturing Method

Next, an example of a manufacturing process of the magnetic memory cell 1 according to the present exemplary embodiment will be described below.

Figure 12:
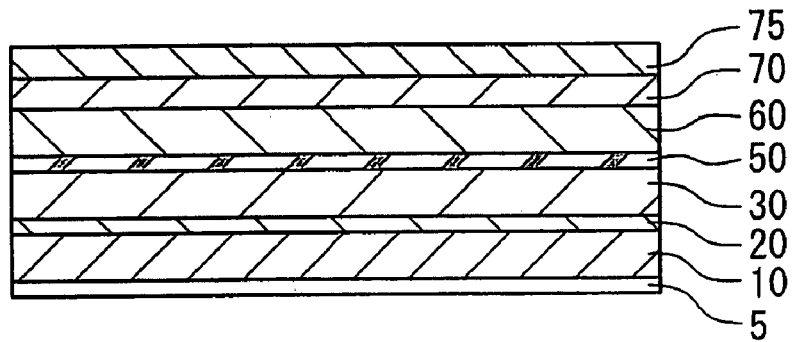
FIG. 12 is a cross-sectional view showing a manufacturing process of the magnetic memory cell according to the exemplary embodiment of the present invention.

First, as shown in FIG. 12, a first ferromagnetic layer 10 as the above-mentioned first free layer 10 is formed on a seed layer 5. The seed layer 5 is a layer for controlling crystal growth at the time of forming the first ferromagnetic layer 10. Material with a high electric resistance is used for the seed layer 5. The first ferromagnetic layer 10 is exemplified by a ferromagnetic metal layer such as NiFe, CoFe, NiFeCo and the like. The first ferromagnetic layer 10 may include non-magnetic element such as B, C, O, Zr and the like as additive.

Next, the intermediate layer 20 is formed on the first ferromagnetic layer 10. The intermediate layer 20 is a nonmagnetic layer and, for example, is formed of nonmagnetic metal such as Ru, Cu, Ir, Rh and the like. A thickness of the intermediate layer 20 is designed such that the desired magnetic coupling between the first free layer 10 and the second free layer 30 can be achieved. It should be noted that the intermediate layer 20 plays a role of protecting the first ferromagnetic layer 10 from damages due to oxidation and etching, as described later.

Next, a second ferromagnetic layer 30 as the above-mentioned second free layer 30 is formed on the intermediate layer 20. The second ferromagnetic layer 30 is exemplified by a ferromagnetic metal layer such as NiFe, CoFe, NiFeCo and the like. The second ferromagnetic layer 30 may include nonmagnetic element such as B, C, O, Zr and the like as additive.

Next, the tunnel barrier layer 50 that is a nonmagnetic layer is formed on the second ferromagnetic layer 30. For example, the tunnel barrier layer 50 is a thin insulating film. The insulating film is exemplified by a $Al_2O_3$ film, a $SiO_2$ film, a MgO film and a AlN film. Besides, nonmagnetic metal such as Cu, Zn, Au, Ag, Al and the like can be used as the tunnel barrier layer 50.

Next, a third ferromagnetic layer 60 as the above-mentioned pinned layer 60 is formed on the tunnel barrier layer 50. The third ferromagnetic layer 60 is exemplified by a CoFe film. Moreover, an anti-ferromagnetic layer 70 for fixing a magnetization orientation of the third ferromagnetic layer 60 is formed on the third ferromagnetic layer 60. Furthermore, a cap layer 75 is formed on the anti-ferromagnetic layer 70. In this manner, a laminated structure shown in FIG. 12 is obtained.

Figure 13:
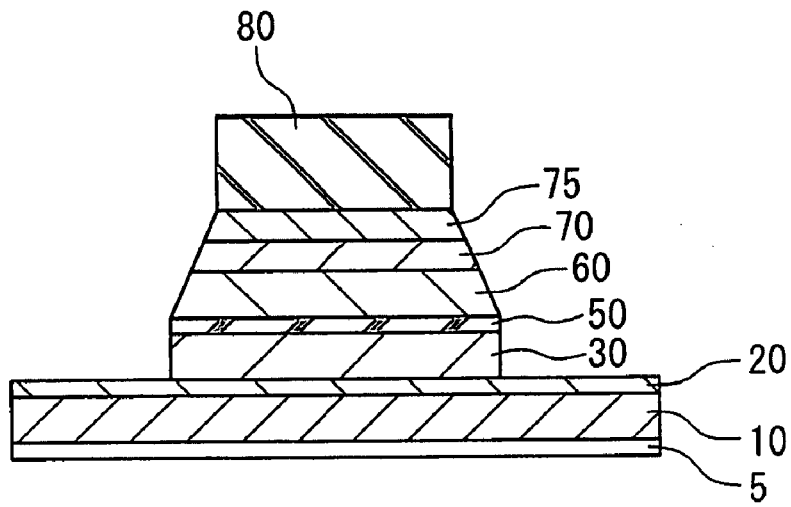
FIG. 13 is a cross-sectional view showing the manufacturing process of the magnetic memory cell according to the exemplary embodiment of the present invention.

Next, as shown in FIG. 13, a mask 80 having a predetermined pattern is formed on the above-mentioned laminated structure by a photolithographic technique. Subsequently, the etching using the mask 80 is performed. For example, reactive gas etching (RIE) or ion milling is performed as the etching. In the etching, the intermediate layer 20 is used as an "etching stopper layer". That is, the cap layer 75, the anti-ferromagnetic layer 70, the third ferromagnetic layer 60, the tunnel barrier layer 50 and the second free layer 30 are sequentially etched until the intermediate layer 20 is exposed.

As described above, at the time of the write operation, the domain wall DW moves in the magnetization switching region 13 of the first free layer 10. If a surface of the magnetization switching region 13 is damaged by reactive gas, ions, radicals and the like during the etching, the domain wall cannot smoothly move in the magnetization switching region 13. According to the present exemplary embodiment, the first ferromagnetic layer 10 is protected from the damages by the etching stopper layer 20 (intermediate layer 20). Therefore, at the time of the write operation, the domain wall motion in the magnetization switching region 13 can be smoothly performed, namely, mobility of the domain wall is improved.

Next, patterning of the intermediate layer 20 and the first ferromagnetic layer 10 is performed. As a result, the structure of the first free layer 10 according to the present exemplary embodiment can be obtained (refer to FIG. 2 to FIG. 8). The intermediate layer 20 may have the same planar shape as that of the first free layer 10. For the above-described reason, it is preferable that the intermediate layer 20 covers at least the magnetization switching region 13 of the first free layer 10. Furthermore, the magnetization orientations of the first magnetization fixed region 11 and the second magnetization fixed region 12 of the first free layer 10 are fixed. The magnetization fixation is as described in the foregoing section 2-5.

Figure 14:
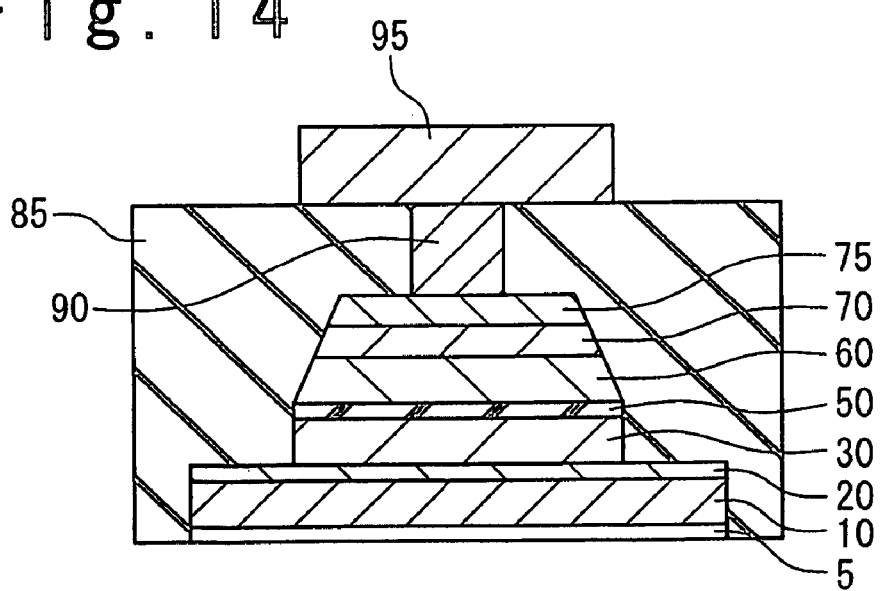
FIG. 14 is a cross-sectional view showing the manufacturing process of the magnetic memory cell according to the exemplary embodiment of the present invention.

Next, as shown in FIG. 14, an interlayer insulating film 85 is blanket deposited and then CMP (Chemical Mechanical Polishing) is performed. Subsequently, a via hole is so formed as to reach the cap layer 75, and a via 90 is formed by filling in the via hole with metal. Furthermore, an upper electrode 95 connected to the via 90 is formed. In this manner, the magnetic memory cell 1 according to the present exemplary embodiment is fabricated.

5. Effects

Effects of the write method of the domain wall motion type MRAM according to the present exemplary embodiment are as follows.

First, excellent selectivity of the memory cell can be ensured as compared with the asteroid method. In the case of the asteroid method, variation in a threshold value of a write magnetic field deteriorates the memory cell selectivity in a 2-dimensional memory cell array. According to the spin transfer method, however, the write current acts only on a target memory cell. Thus, the disturbance is greatly reduced. In other words, a selective writing property is improved.

Also, a scaling property of the write current is improved as compared with the asteroid method and the toggle method. In the case of the asteroid method and the toggle method, a magnetic switching field necessary for switching the magnetization of the magnetic switching region increases in substantially inverse proportion to the memory cell size. That is to say, the write current ends to increase with the miniaturization of the memory cell. According to the spin transfer method, however, the threshold value of the magnetization switching depends on current density. Since the current density is increased with the reduction of the memory cell size, it is possible to reduce the write current with the miniaturization of the memory cell. In other words, it is not necessary to increase the write current when the memory cell size is reduced. In that sense, the scaling property of the write current is improved. This is important in realizing a large-capacity MRAM.

Also, a current-magnetic field conversion efficiency is increased as compared with the asteroid method and the toggle method. In the case of the asteroid method and the toggle method, the write current is consumed by Joule heating. It has been necessary to provide a write-dedicated wiring such as a flux keeper and a yoke structure in order to enhance the current-magnetic field conversion efficiency. This causes complexity of the manufacturing process and an increase in wiring inductance. According to the spin transfer method, however, the write current directly contributes to the spin transfer. Therefore, the current-magnetic field conversion efficiency is increased. Consequently, the complexity of the manufacturing process and the increase in the wiring inductance can be prevented.

Moreover, the deterioration of the MTJ (tunnel barrier layer 50) is suppressed as compared with the CPP (Current Perpendicular to Plane) spin transfer method. In the case of the CPP method, the write current is injected in a direction perpendicular to the film plane. The write current at the time of data writing is much larger than the read current, and there is a possibility that the large current destroys the tunnel barrier layer 50. According to the write method in the present exemplary embodiment, however, a current path at the time of reading and a current path at the time of writing are separated from each other. More specifically, the write currents IW1 and IW2 do not penetrate through the MTJ but flow within the plane of the first free layer 10 at the time of the data writing. It is not necessary at the time of the data writing to inject a large current in a direction perpendicular to the MTJ film plane. Consequently, the deterioration of the tunnel barrier layer 50 in the MTJ can be suppressed.

Moreover, a write speed increases with miniaturization of the memory cell. The reason is that the data writing is performed by the domain wall motion in the first free layer 10 according to the present exemplary embodiment. The reduction in the memory cell size means that a movement distance of the domain wall DW becomes smaller. Accordingly, the write speed increases with the reduction in the memory cell size.

Also, the magnetic recording layer 40 of the domain wall motion type MRAM according to the present exemplary embodiment includes plural (more than two) free layers that are magnetically coupled to each other. Effects of such the structure are as follows.

At the time of the write operation, the domain wall moves in the magnetization switching region 13 of the first free layer 10. According to the present exemplary embodiment, the intermediate layer 20 is so formed as to cover at least the magnetization switching region 13. The intermediate layer 20 plays a role of protecting the magnetization switching region 13 from damages due to oxidation and etching during the manufacturing process. If there is not the intermediate layer 20 covering the magnetization switching region 13, a surface of the magnetization switching region 13 is damaged by reactive gas, ions, radicals and the like during the etching. Then, the domain wall cannot smoothly move in the magnetization switching region 13. However, according to the present exemplary embodiment, the magnetization switching region 13 is protected from the damages by the intermediate layer 20. Therefore, the domain wall motion in the magnetization switching region 13 can be smoothly performed, namely, the mobility of the domain wall is improved. As a result, reliability and yield of the domain wall motion type MRAM are improved.

Furthermore, according to the present exemplary embodiment, the magnetic recording layer 40 has the first free layer 10 and the second free layer 30 separately. Among them, the first free layer 10 is the domain wall motion layer in which the domain wall moves and thus greatly contributes to write characteristics (e.g., magnitude of the write current and the like). On the other hand, the second free layer 30 being in contact with the tunnel barrier layer 50 is a layer constituting the MTJ together with the pinned layer 60 and thus greatly contributes to read characteristics (e.g., a MR ratio and the like). It is therefore possible according to the structure of the present exemplary embodiment to control the write characteristic and the read characteristic independently of each other.

For example, since the write characteristic is mainly controlled by the first free layer 10, material (such as NiFe) that improves the write characteristic can be used as the material of the first free layer 10. Meanwhile, since the read characteristic is mainly controlled by the second free layer 30, material (such as CoFe and CoFeB) that improves the read characteristic can be used as the material of the second free layer 30.

In the case of the spin transfer method, the write current required for the magnetization switching decreases as saturation magnetization of a magnetic layer becomes smaller. Whereas, when the saturation magnetization of the magnetic layer is decreased, polarizability of the magnetic layer is lowered. In this case, the TMR effect is decreased and hence the MR ratio is lowered. That is to say, there is in general a trade-off relationship between improvement in the MR ratio and reduction in the write current. However, according to the present exemplary embodiment, the first free layer 10 and the second free layer 30 can be designed independently of each other. Accordingly, it is possible to design the saturation magnetization of the first free layer 10 to be comparatively small while to design the saturation magnetization of the second free layer 30 to be comparatively large. As a result, increase in the MR ratio (read margin) and reduction in the write current can be achieved at the same time.

According to the present exemplary embodiment, as described above, it is possible to control the respective characteristics of the first free layer 10 and the second free layer 30 freely and independently of each other. This means improvement in device design freedom, which enables improvement in both of the write characteristic and the read characteristic. This merit cannot be obtained by the CPP spin transfer method. The reason is that both of the write characteristic and the read characteristic are subject to a ferromagnetic layer adjacent to a tunnel barrier layer, in the case of the CPP spin transfer method. Moreover, even in a case of the spin transfer method based on a planar write current, the above-described merit cannot be obtained if only one free layer is used (i.e., if the second free layer 30 does not exist). The reason is that the first free layer 10, where the domain wall moves, simultaneously serves as one end of the MTJ and thus affects not only the write characteristic but also the read characteristic.

According to the present exemplary embodiment, the above-described effects can be simultaneously obtained. The technique according to the present exemplary embodiment is extremely useful in order to realize a high-integration, high-speed operation and low power consumption MRAM.

The exemplary embodiment of the present invention has been described above with reference to the attached drawings. However, the present invention is not limited to the above-described exemplary embodiment and can be appropriately modified by a person skilled in the art without departing from the scope of the invention.

The invention claimed is:

1. A magnetic random access memory comprising:
a pinned layer whose magnetization orientation is fixed; and
a magnetic recording layer connected to said pinned layer through a first nonmagnetic layer,
wherein said magnetic recording layer comprises:
a first free layer;
a second free layer being in contact with said first nonmagnetic layer and having reversible magnetization; and
a second nonmagnetic layer provided between said first free layer and said second free layer,
wherein said first free layer includes:
a magnetization switching region having reversible magnetization and overlapping said second free layer;
a first magnetization fixed region connected to a first boundary of said magnetization switching region and whose magnetization orientation is fixed in a first direction; and
a second magnetization fixed region connected to a second boundary of said magnetization switching region and whose magnetization orientation is fixed in a second direction,
wherein both of said first direction and said second direction are directions toward said magnetization switching region or directions away from said magnetization switching region,
magnetization of said magnetization switching region is directed to said first boundary or said second boundary,
a domain wall is formed at said first boundary or said second boundary in said first free layer, and
data writing is performed by moving said domain wall,
wherein said second free layer has no domain wall,
said second nonmagnetic layer is so formed as to cover at least said magnetization switching region, and
said magnetization switching region of said first free layer and said second free layer are magnetically coupled to each other through said second nonmagnetic layer.

2. The magnetic random access memory according to claim 1,
wherein said second nonmagnetic layer is so formed as to entirely cover said first free layer.

3. The magnetic random access memory according to claim 1,
wherein said second nonmagnetic layer has a same planar shape as that of said first free layer.

4. The magnetic random access memory according to claim 1,
wherein said magnetization switching region and said second free layer are anti-ferromagnetically coupled to each other through said second nonmagnetic layer.

5. The magnetic random access memory according to claim 1,
wherein said magnetization switching region and said second free layer are ferromagnetically coupled to each other through said second nonmagnetic layer.

6. The magnetic random access memory according to claim 1, wherein said magnetization switching region and said second free layer are magneto-statically coupled to each other through said second nonmagnetic layer.

7. The magnetic random access memory according to claim 1,
wherein said magnetization switching region, said first magnetization fixed region and said second magnetization fixed region are formed in a same plane.

8. The magnetic random access memory according to claim 1,
wherein in a first write operation, a first write current is flowed from said first magnetization fixed region to said second magnetization fixed region through said magnetization switching region and a domain wall moves from said second boundary to said first boundary in said magnetization switching region, and
wherein in a second write operation, a second write current is flowed from said second magnetization fixed region to said first magnetization fixed region through said magnetization switching region and a domain wall moves from said first boundary to said second boundary in said magnetization switching region.

* * * * *